United States Patent [19]

Takenaka et al.

[11] Patent Number: 4,836,434
[45] Date of Patent: Jun. 6, 1989

[54] METHOD AND APPARATUS FOR AIRTIGHTLY PACKAGING SEMICONDUCTOR PACKAGE

[75] Inventors: Takaji Takenaka; Hideki Watanabe, both of Hadano; Fumiyuki Kobayashi, Sagamihara, all of Japan

[73] Assignee: Hitachi, Ltd., Tokyo, Japan

[21] Appl. No.: 868,440

[22] Filed: May 30, 1986

[30] Foreign Application Priority Data

May 31, 1985 [JP] Japan .................. 60-116408

[51] Int. Cl.$^4$ .......................................... H01L 21/50
[52] U.S. Cl. .......................... 228/179; 228/8; 228/219; 228/121
[58] Field of Search ............ 228/121, 124, 179, 188, 228/200, 8, 44.7, 219

[56] References Cited

U.S. PATENT DOCUMENTS

| | | | |
|---|---|---|---|
| 3,392,442 | 7/1968 | Napier | 29/840 |
| 3,486,223 | 12/1969 | Butera | 228/219 |
| 3,921,285 | 11/1975 | Krall | 29/840 |
| 4,077,114 | 3/1978 | Sakuma | 228/179 |
| 4,470,539 | 9/1984 | Diem | 228/193 |

FOREIGN PATENT DOCUMENTS 53-5570 of 1978 Japan .
53-20860 of 1978 Japan .

Primary Examiner—Kurt Rowan
Attorney, Agent, or Firm—Antonelli, Terry & Wands

[57] ABSTRACT

An airtight packaging apparatus for covering with a cap a multichip module having LSI chips mounted on a ceramic substrate and for sealing the cap and substrate by means of solder includes a receptacle for accommodating the multichip module, valves for supplying gas to the receptacle and exhausting the receptacle, a retainer for holding the cap and adjusting the positional relation with respect to the multichip module, and a heater for heating solder of the junction between the multichip module and the cap. After solder has been heated and melted, the multichip module and the cap are sealed to each other.

4 Claims, 2 Drawing Sheets

METHOD AND APPARATUS FOR AIRTIGHTLY PACKAGING SEMICONDUCTOR PACKAGE

BACKGROUND OF THE INVENTION

The present invention relates to a method and an apparatus for airtightly packaging a semiconductor package, and more particularly to a method and an apparatus for airtight packaging of a semiconductor package suitable for solder sealing a multi-chip module having a large number of LSI chips mounted on a ceramic substrate.

A semiconductor package is formed by attaching a cap to a substrate such as a ceramic substrate having semiconductor devices mounted thereon by solder and by sealing them, with the semiconductor devices being airtightly packaged in a space formed by the substrate and the cap.

Airtight solder packaging for a multi-chip module having semiconductor devices mounted on a ceramic substrate is conducted in a hermetically sealed receptacle as described in, for example, Japanese Patent Unexamined Publication Nos. 5570/78 and 20860/78 (JP-A-53-5570 and JP-A-53-20860). As disclosed in these publications, the difference in temperature and pressure between the inside and outside of the module caused during the solidification process of solder is eliminated in order to prevent a short circuit or the like due to a projection of solder in the space within the package. In methods described in Japanese Patent Unexamined Publication Nos. 148445/80 and 22493/77 (JP-A-55-148445 and JP-A-52-22493), metal for absorbing the surplus solder is disposed at a minute interval on the internal periphery of the metal portion whereto solder is to be attached. In a method disclosed in Japanese Patent Unexamined Publication No. 7172/78 (JP-A-53-7172), a groove for stopping the surplus solder is provided instead of the metal for absorbing the surplus solder. In the above-described publications, it is assumed that the weight of either the cap or the substrate (wiring substrate) is smaller than the surface tension of the solder for airtight packaging. If the weight of the cap or the wiring substrate is increased due to, for example, a large-sized package the packaging solder is crushed and scattered inside and outside the package when it is melted. As a result, the desired amount of solder may not be ensured or an electrical short circuit may be caused. It is necessary to ensure a sufficient amount of sealing solder for the purpose of absorbing the thermal strain as a buffer when there is a difference in thermal expansion between the cap and the wiring substrate and for the purpose of reliable soldering. From this point of view, a method for packaging the heavy cap and the wiring substrate by solder has been demanded.

SUMMARY OF THE INVENTION

An object of the present invention is to provide a highly reliable method for airtightly packaging a semiconductor package whereby a desired solder connection shape is obtained independently of the weight of the cap or the substrate.

Another object of the present invention is to provide an airtight packaging apparatus effecting the above-described method.

In accordance with the present invention, a substrate having semiconductor devices mounted thereon and a cap are put into a receptacle having a controlled gas pressure, solder is melted while the gap between a seal portion of the substrate and a seal portion the cap is so adjusted that the seal portions of the substrate and the cap may be in contact with each other through the melted solder, and the seal portions are cooled down.

DESCRIPTION OF THE PREFERRED EMBODIMENT

Figure 1:
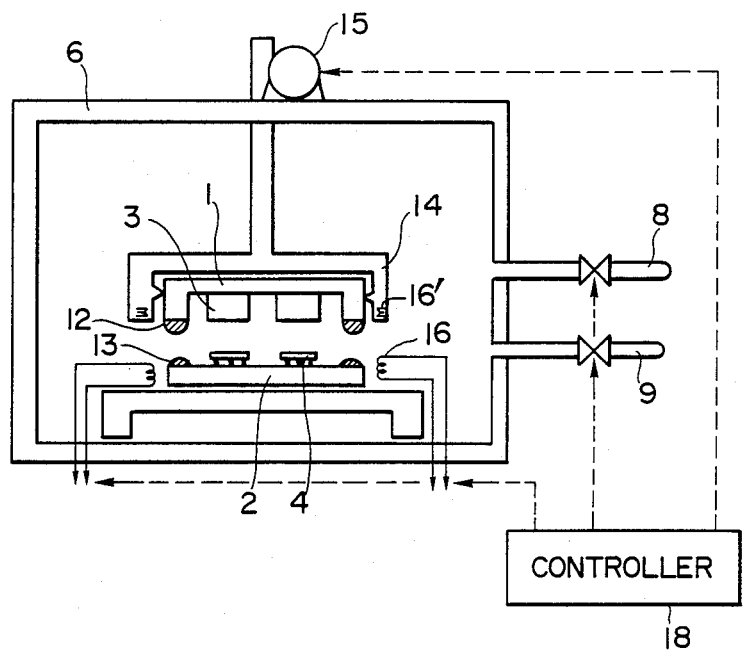
FIG. 1 is a sectional view for illustrating the structure of an apparatus according to the present invention.

As shown in FIG. 1, a exhaust valve 8 and a sealing gas supply valve 9 are connected to a receptacle 6 for airtight packaging. A substrate 2 of a semiconductor package having semiconductor devices 4 mounted thereon is placed on a stand contained in the receptacle 6.

On the other hand, a cap 1 of the semiconductor package is retained by a retainer 14. Thermal conductive connectors 3, mounted inside the cap 1, come in contact with backs of the semiconductor devices 4 and transfers heat generated by semiconductor devices to the cap 1 to dissipate the heat. However, the thermal conductive connectors are not essential to the semiconductor package. The retainer 14 extends to the outside of the receptacle 6 and is moved upward and downward by servomechanism 15. In addition, a heater 16 for heating is disposed near seal portions of the substrate 2 and the cap 1.

In a FIG. 1, a heater 16' is disposed near the seal portion of the retainer 14. The seal portions of the cap 1 and the substrate 2 are provided with presolders 12 and 13 for sealing. A programmable controller 18 controls the valves 8 and 9, the servomechanism 15 and the heaters 16 and 16'.

Figure 2:
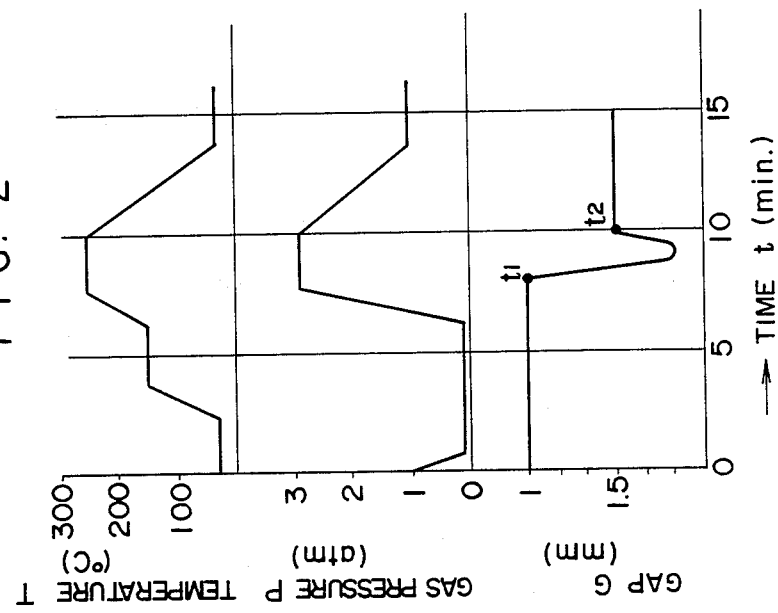
FIG. 2 is an operation time chart of the apparatus shown in FIG. 1.

FIG. 2 is a time chart for illustrating the operation of the apparatus of FIG. 1 and represents the temperature T of a seal region (inclusive of the seal portions of the cap 1 and the substrate) within the receptacle, gas pressure P within the receptacle, and gap G between the seal portions of the cap 1 and the substrate respectively as functions of time.

With reference to FIG. 1, the inside of the receptacle 6 is once evacuated to eliminate the air, and the temperature of the seal region is raised from the room temperature to approximately 150° C. to effect vacuum baking. By the vacuum baking, the gas absorbed by the seal portions is eliminated. After completion of the vacuum baking, the temperature T is raised to and kept at approximately 230° C. And the sealing gas such as He gas is supplied into the receptacle 1 through the valve 9 to bring the inside of the receptacle 1 to approximately three atmospheres and maintain that pressure. Thereby, the presolders 12 and 13 provided at the seal portions of the cap 1 and the substrate 2 are melted. At time instant $t_1$, the retainer 14 for retaining the cap 1 is lowered by the servomechanism 15 to joint the solders 12 and 13. In order to eliminate bubbles contained in the melted solder, the cap 1 is lowered at such a speed that the solder will not be scattered. As shown in FIG. 2, the gap G between the seal portions is preferably reduced to a value (0.2 mm, for example) smaller than a predetermined gap (0.5 mm, for example) and thereafter adjusted to have the predetermined gap.

Figure 3:
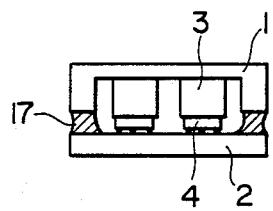
FIG. 3 is a sectional view of a sealed semiconductor package.

If the semiconductor package is increased in size, a solder of the cap 1 is not in contact with that of the substrate over some part of the whole periphery due to warp of the substrate, resulting in a packaging failure. This can be prevented by once pulling down the cap 1 lower than the predetermined height as described above. Further, the solder 17 takes the shape of hand-drum as shown in FIG. 3 representing the completed package by once pulling down the cap 1 lower than the predetermined height. When the semiconductor device is mounted on the substrate by solder balls, it is said that solder shaped like a hand-drum provides a higher connection reliability. In the packaging according to the present invention as well, a similar effect can be anticipated by making solder shaped like a hand-drum.

From time instant $t_2$ at which the gap between the cap 1 and the substrate has reached the predetermined value, the heater temperature is lowered to start the cooling process. Since the temperature within the package generally drops faster than that within the receptacle 6, the gas pressure $P_1$ within the package becomes lower than the gas pressure $P_2$ within the receptacle. Therefore, it is necessary to maintain the relation $P_1=P_2$ until the temperature which solder is solidified is reached, by controlling the valves to control the gas pressure of the receptacle 6 concurrently with the drop in temperature. If the gas pressure $P_1$ within the package becomes lower than the gas pressure outside the package, the melted solder flows into the space within the package, resulting in solder projection. In order to attain the relation $P_1=P_2$ in the present apparatus, the gas pressure $P_1$ within the package is experimentally derived with respect to various cooling instants. The resultant characteristic curve representing the gas pressure $P_1$ within the package as a function of cooling time t is stored in the controller 18. A curve P of FIG. 2 after time instant $t_2$ is that characteristic curve. After cooling has been started, the controller 18 derives the gas pressure within the receptacle on the basis of the characteristic curve and controls the valve 8.

Such control for attaining the relationship $P_1=P_2$ is conducted until solder is solidified. In Pb-Sn eutectic solder, for example, control for attaining the relationship $P_1=P_2$ is effected until the solid phase temperature of 183° C. is reached.

Figure 4:
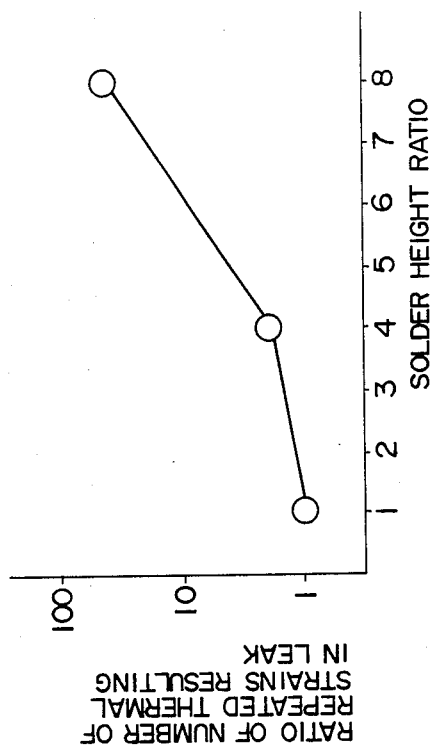
FIG. 4 shows the relationship between the solder height and the number of repeated thermal strains eventually resulting in He leak.

FIG. 4 shows experimental results concerning the number of repeated thermal strains causing a leak failure of He contained in a semiconductor package sealed by means of solder in accordance with the method of FIG. 1. The number is plotted as a function of the height of sealing solder. As the solder height is increased, the number of thermal strains until the He leak is caused is also increased, resulting in a longer life. By increasing the solder height, therefore, it is possible to absorb the difference in thermal expansion between the cap and the substrate. Accordingly, is becomes possible to select a material such as copper or aluminum having a property such as high thermal conductivity desired as the property of the cap without being subject to restriction by the thermal expansion difference from the substrate made of alumina ceramic or mullite ceramic, for example. It is thus possible to realize high seal reliability and cooling capability. Therefore, the controller 18 adjusts the solder height so as to produce flexibility enough to absorb the thermal expansion difference between the substrate and the cap.

As described above, the present invention provides an accurate solder connection shape irrespective of the weight of the cap or wiring substrate. As a result, a highly reliable structure for airtightly packaging a semiconductor package can be obtained.

We claim:

1. An apparatus for airtightly packaging a semiconductor package by sealing with solder a cap to a substrate having semiconductor devices mounted thereon and sealing them, the apparatus comprising:

a receptacle for accommodating said semiconductor package therein;

holding means for holding at least one of said substrate and said cap in said receptacle and adjusting a positional relationship between said substrate and said cap;

heating means for heating solder at a seal region between said substrate and said cap to melt the solder; and control means for controlling the movement of said holding means including means activated after said solder has been melted for controlling said holding means so that a gap between said substrate and said cap is changed to a value less than a predetermined value and thereafter to said predetermined value.

2. An apparatus according to claim 1, further comprising means for supplying gas to said receptacle and exhausting said receptacle; and wherein said control means includes means for controlling said gas supplying and exhausting means to control a gas pressure in said receptacle and means for controlling said heating means to start a cooling upon a change of said gap to said predetermined value.

3. An apparatus according to claim 1, wherein said control means includes means for controlling said gas supplying and exhausting means to make the gas pressure in said receptacle equal to a gas pressure in said semiconductor package.

4. An apparatus for air tightly packaging a semiconductor by sealing with solder a cap to a substrate having semiconductor devices mounted thereon, the apparatus comprising:

a receptacle for placing one of said substrate and said cap therein;

means for supplying gas to said receptacle and exhausting said receptacle;

holding means accommodated in said receptacle for mechanically holding the other of said substrate and said cap;

arm means mechanically connected to said holding means at one end thereof and said receptacle at the other end thereof and being responsive to an electrical signal for vertically moving said holding means toward said one of said substrate and said cap such that seal portions of said substrate and cap approximate each other;

heating means for heating solder at a seal region between said substrate and said cap to melt the solder; and control means for controlling said gas supplying and exhausting means to control a gas supply in said receptacle, for controlling the movement of said holding means, and for controlling said heating means;

said control means having circuit means for supplying said arm means with said electrical signal designating a moving direction of the arm means, wherein after said solder has been melted, said control means control said holding means so that a gap between said substrate and said cap is changed to a value less than a predetermined value and thereafter to said predetermined value, and said control means control said heating means to start a cooling operation upon a change of said gap to said predetermined value.

* * * * *